(12) United States Patent
Lee et al.

(10) Patent No.: US 8,592,881 B2
(45) Date of Patent: Nov. 26, 2013

(54) ORGANIC LIGHT EMITTING ELEMENT AND METHOD OF MANUFACTURING THE SAME

(75) Inventors: Yun-gyu Lee, Suwon-si (KR); Byoung-deog Choi, Suwon-si (KR); Hye-hyang Park, Suwon-si (KR); Ki-ju Im, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 473 days.

(21) Appl. No.: 12/098,641

(22) Filed: Apr. 7, 2008

(65) Prior Publication Data

US 2009/0008665 A1   Jan. 8, 2009

(30) Foreign Application Priority Data

Jul. 4, 2007   (KR) .................. 10-2007-0066880

(51) Int. Cl.
*H01L 31/062* (2012.01)
*H01L 31/113* (2006.01)

(52) U.S. Cl.
USPC .............. 257/292; 257/59; 257/72; 257/105; 257/110; 257/120; 257/133; 257/140; 257/167; 257/458; 257/656; 257/E31.088; 257/E31.087; 257/E29.336; 257/E51.022; 439/41; 439/43; 439/47; 439/50; 439/113; 362/257; 362/296.01; 362/299; 362/308; 362/311.02; 313/483; 313/498; 313/512; 445/24; 345/207; 250/370.14

(58) Field of Classification Search
USPC ......... 257/4, 57, 59, 61, 66, 69, 72, 105, 110, 257/120, 132, 133, 140, 167, 292, 458, 656, 257/E31.061, E31.087, E31.088, E29.336, 257/E51.022; 439/41, 43, 47, 48–50, 113; 362/257, 296.01, 299, 308, 296.04, 362/311.02; 313/483, 498–512; 445/24; 345/207; 250/370.14
See application file for complete search history.

(56) References Cited

U.S. PATENT DOCUMENTS

2001/0028060 A1   10/2001   Yamazaki et al.
2005/0274988 A1   12/2005   Hong
(Continued)

FOREIGN PATENT DOCUMENTS

CN   1555099   12/2004
EP   1 619 725   1/2006
(Continued)

OTHER PUBLICATIONS

Communication issued by the European patent Office on Jul. 20, 2010.

*Primary Examiner* — Meiya Li
(74) *Attorney, Agent, or Firm* — H.C. Park & Associates, PLC

(57) ABSTRACT

An organic light emitting element includes an organic light emitting diode formed on a substrate, coupled to a transistor including a gate, a source and a drain and including a first electrode, an organic thin film layer and a second electrode; a photo diode formed on the substrate and having a semiconductor layer including a high-concentration P doping region, a low-concentration P doping region, an intrinsic region and a high-concentration N doping region; and a controller that controls luminance of light emitted from the organic light emitting diode, to a constant level by controlling a voltage applied to the first electrode and the second electrode according to the voltage outputted from the photo diode.

9 Claims, 7 Drawing Sheets

(56) References Cited

U.S. PATENT DOCUMENTS

2007/0138951 A1    6/2007  Park et al.
2007/0200971 A1*  8/2007  Koide et al. .................... 349/61
2007/0215969 A1*  9/2007  Koide et al. .................. 257/431
2008/0185596 A1*  8/2008  Tseng et al. .................... 257/84
2008/0272277 A1*  11/2008  Wei ............................... 250/205
2009/0050891 A1    2/2009  Katoh

FOREIGN PATENT DOCUMENTS

| | | |
|---|---|---|
| EP | 1 801 883 A1 | 6/2007 |
| JP | 03-109779 | 5/1991 |
| JP | 3-232279 | 10/1991 |
| JP | 10-163517 | 6/1998 |
| JP | 2001-085160 | 3/2001 |
| JP | 2002-062856 | 2/2002 |
| JP | 2003-152217 | 5/2003 |
| JP | 2003-158291 | 5/2003 |
| JP | 2005-019636 | 1/2005 |
| JP | 2005-092006 | 4/2005 |
| JP | 2005-116681 | 4/2005 |
| JP | 2006-003857 | 1/2006 |
| JP | 2006-80306 | 3/2006 |
| JP | 2006-332287 | 12/2006 |
| JP | 2007-095878 | 4/2007 |
| JP | 2007-173832 | 7/2007 |
| KR | 2005-2606 | 1/2005 |
| KR | 2005-9211 | 1/2005 |
| KR | 2005-31397 | 4/2005 |
| KR | 2005-58395 | 6/2005 |
| KR | 2005-65304 | 6/2005 |
| KR | 2005-121090 | 12/2005 |
| KR | 2006-58573 | 5/2006 |
| KR | 2006-77138 | 7/2006 |
| KR | 2006-88082 | 8/2006 |
| KR | 10-729047 | 6/2007 |
| WO | WO 2005/081810 | 9/2005 |
| WO | WO 2006/118044 | 11/2006 |
| WO | WO 2006/129428 | 12/2006 |
| WO | WO 2006129428 A1 * | 12/2006 |

* cited by examiner

ORGANIC LIGHT EMITTING ELEMENT AND METHOD OF MANUFACTURING THE SAME

CROSS-REFERENCE TO RELATED APPLICATION

This application claims the benefit of Korean Application No. 2007-66880, filed Jul. 4, 2007, in the Korean Intellectual Property Office, the disclosure of which is incorporated herein by reference.

BACKGROUND OF THE INVENTION

1. Field of the Invention

Aspects of the present invention relate to an organic light emitting element and a method of manufacturing the same. More particularly, aspects of the present invention relate to an organic light emitting element having a photo diode in which a low-concentration P doping region is formed, and a method of manufacturing the same.

2. Description of the Related Art

Organic light emitting elements are the next-generation display devices having self-light emission properties. Organic light emitting elements have excellent physical properties in terms of viewing angle, contrast, response time, power consumption and the like, compared to the liquid crystal display devices (LCDs).

The organic light emitting element includes organic light emitting diodes comprising an anode electrode, an organic thin film layer and a cathode electrode. Types of organic light emitting elements include a passive matrix mode in which an organic light emitting diode is coupled between scan lines and signal lines in a matrix mode to constitute pixels and an active matrix mode in which operation of respective pixels is controlled by a thin film transistor (TFT) that functions as a switch.

However, the conventional organic light emitting elements have problems that, because an organic thin film layer that emits the light is composed of organic materials, the film quality and light emission properties deteriorate with time, which leads to a reduction in luminance of the light. Also, the contrast of the organic light emitting device may be worsened by the reflection of light incident from the outside.

SUMMARY OF THE INVENTION

Accordingly, aspects of the present invention provide an organic light emitting element having a photo diode to control luminance of the light that is emitted according to the quantity of the light incident from the outside, and a method of manufacturing the same.

Also, aspects of the present invention provide an organic light emitting element capable of enhancing a light detection efficiency of a photo diode, and a method of manufacturing the same.

Also, aspects of the present invention provide an enhanced current efficiency of a photo diode by providing a low-concentration P doping region formed in the photo diode.

In addition, aspects of the present invention provide photo diodes coupled in parallel to each other to enhance a light detection efficiency.

According to an embodiment of the present invention, there is provided an organic light emitting element that includes an organic light emitting diode formed on a substrate, coupled to a transistor including a gate, a source and a drain, and including a first electrode, an organic thin film layer and a second electrode; a photo diode formed on the substrate and having a semiconductor layer joined into a high-concentration P doping region, a low-concentration P doping region, an intrinsic region and a high-concentration N doping region; and a controller to control luminance of the light, emitted from the organic light emitting diode, to a constant level by controlling a voltage applied to the first electrode and the second electrode according to the voltage outputted from the photo diode.

According to an embodiment of the present invention, there is provided a method of manufacturing an organic light emitting element, the method comprising: forming first and second semiconductor layers on a substrate or on a buffer layer formed on the substrate; forming a photo diode by forming a high-concentration P doping region, a low-concentration P doping region, an intrinsic region and a high concentration N doping region in the first semiconductor layer; forming a transistor by forming source and drain region and a channel region in the second semiconductor layer and forming a gate electrode insulated from the channel region; and forming an organic light emitting diode electrically connected to the transistor According to an embodiment of the present invention, there is provided a method of manufacturing an organic light emitting element that includes forming a buffer layer on a substrate; forming first and second semiconductor layers on the buffer layer; forming a photo diode in the first semiconductor layer, the photo diode having a high-concentration P doping region, a low-concentration P doping region, an intrinsic region and a high concentration N doping region and forming a source and drain region and a channel region in the second semiconductor layer; forming a gate insulator in the entire surface including the first and second semiconductor layers, and then forming a gate electrode on the gate insulator formed on the channel region; forming an interlayer insulator in the entire surface including the gate electrode, and then patterning the interlayer insulator and the gate insulator to form a contact hole so as to exposed the source and drain region; forming source and drain electrodes to be coupled to the source and drain regions through the contact hole; forming an overcoat in the entire surface, forming a via hole on the overcoat to expose a predetermined region of the source or drain electrodes, and then forming a first electrode to be coupled to the source or drain electrodes through the via hole; forming a pixel definition layer to expose some region of the first electrode, and then forming an organic thin film layer on the exposed first electrode; and forming a cathode electrode on the pixel definition layer including the organic thin film layer.

The present invention is not limited to the aspects and embodiments described above, and therefore other aspects and embodiments, unless otherwise specified herein, are understood from the following descriptions, as apparent to those skilled in the art.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of embodiments, taken in conjunction with the accompanying drawings of which.

DETAILED DESCRIPTION OF THE EMBODIMENTS

Figure 1:
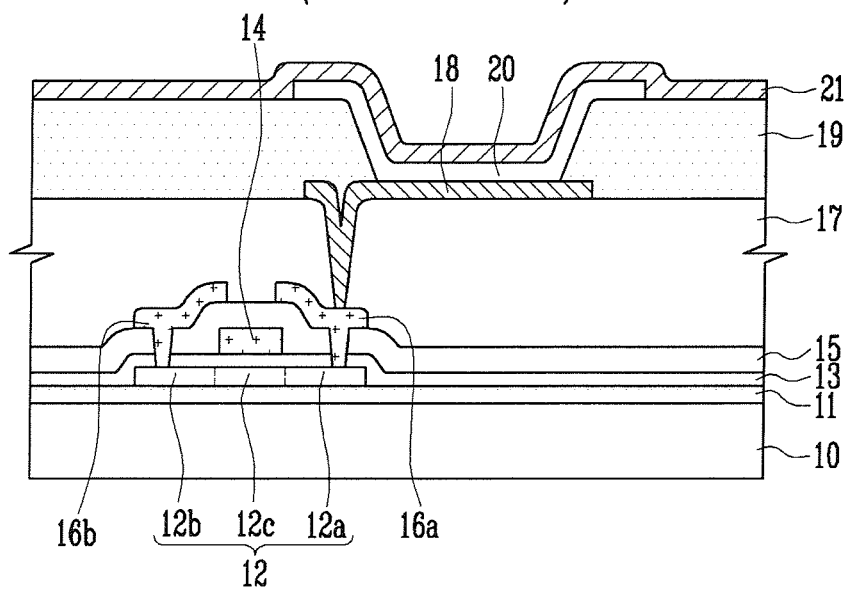
FIG. 1 is a schematic cross-sectional view showing a conventional organic light emitting element including a thin film transistor.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Herein, it is to be understood that where is stated herein that one layer is "formed on" or "disposed on" a second layer, the first layer may be formed or disposed directly on the second layer or there may be an intervening layer between the first layer and the second layer. Further, as used herein, the term "formed on" is used with the same meaning as "located on" or "disposed on" and is not meant to be limiting regarding any particular fabrication process.

A light emission layer of the conventional organic light emitting element has problems in that the luminance of the light produced by the light emission layer is reduced with time as the film quality and light emission properties of the organic materials making up the light emission layer deteriorate with time. In order to solve the above and/or other problems, the present inventors have found a method to control luminance of the emitted light at a constant level by detecting light incident from the outside, or the light emitted from the inside, using a photo diode. However, the light detection area and efficiency of the display device may decrease as the size of the photo diode becomes smaller with the decreasing size and thickness of the display device.

According to aspects of the present invention, light detection efficiency is enhanced by reflecting the light that transmits through a photo diode and the light that is directed toward a substrate when light is incident from the outside and allowing incidence of the light on the photo diode.

FIG. 1 is a schematic cross-sectional view showing a general organic light emitting element including a thin film transistor. A buffer layer 11 is formed on a substrate 10, and a semiconductor layer 12 provided with source and drain regions 12a, 12b and a channel region 12c is formed on the buffer layer 11. A gate electrode 14 that is insulated from the semiconductor layer 12 by a gate insulator 13 is formed on the semiconductor layer 12, and an interlayer insulator 15 is formed on the entire upper surface including the gate electrode 14. The interlayer insulator 15 has a contact hole formed therein to exposed the source and drain regions 12a, 12b. Source and drain electrodes 16a, 16b are formed on the interlayer insulator 15, the source and drain electrodes 16a, 16b being coupled to the source and drain regions 12a, 12b through the contact hole, and an overcoat 17 is formed over the entire upper surface including the source and drain electrodes 16a, 16b. The overcoat 17 has a via hole formed therein to expose the source or drain electrodes 16a or 16b. On the overcoat 17 is formed an anode electrode 18 coupled to the source or drain electrodes 16a or 16b through the via hole and a pixel definition layer 19 that exposes a predetermined region of the anode electrode 18 to define a light emission region. An organic thin film layer 20 and a cathode electrode 21 are formed on the anode electrode 18.

As described above, the organic light emitting element, which comprises an anode electrode 18, an organic thin film layer 20 and a cathode electrode 21, emits light due to an energy gap. Emission of light occurs when a predetermined voltage is applied to the anode electrode 18 and the cathode electrode 21 such that electrons injected through the cathode electrode 21 are recombined with holes injected through the anode electrode 18 in the organic thin film layer 20.

The organic light emitting element as shown in FIG. 1 has a problem that its film quality and light emission properties may deteriorate with time, since the organic thin film layer 20 is made of organic materials.

Figure 2:
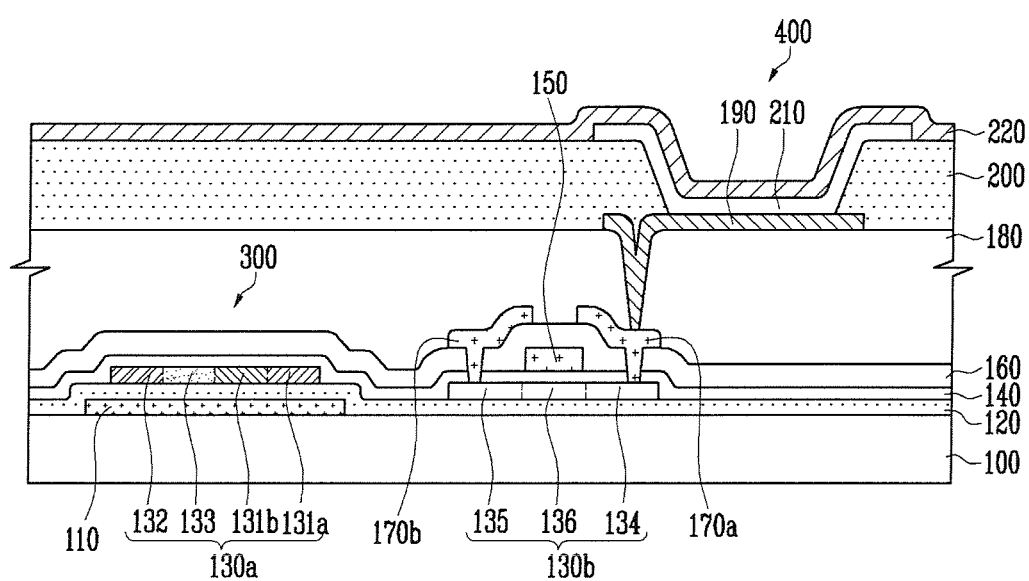
FIG. 2 is a cross-sectional view showing an organic light emitting element having a photo diode according to aspects of the present invention.

FIG. 2 is a cross-sectional view showing an organic light emitting element having a photo diode according to aspects of the present invention. A reflective film 110 is formed in a predetermined region of a substrate 100. The reflective film 110 is formed in a non-light emission region adjoining a light emission region and is made of at least one metal such as Ag, Mo, Ti, Al, or Ni. A buffer layer 120 is formed on the entire surface of the substrate 100 including the reflective film 110. A first semiconductor layer 130a, which comprises a high-concentration P doping region 131a, a low-concentration P doping region 131b, a high-concentration N doping region 132 and an intrinsic region 133, is formed on the buffer layer 120 formed on the reflective film 110. A second semiconductor layer 130b having source and drain regions 134, 135 and a channel region 136 are formed on the buffer layer 120 adjoining the first semiconductor layer 130a. A gate electrode 150, which is insulated from the second semiconductor layer 130b by the gate insulator 140, is formed on the second semiconductor layer 130b, and an interlayer insulator 160 having a contact hole formed therein to expose the source and drain regions 134, 135 is formed on the entire upper surface including the gate electrode 150. Source and drain electrodes 170a, 170b, which are coupled to the source and drain regions 134, 135 through the contact hole, are formed on the interlayer insulator 160, and an overcoat 180, which has a via hole formed therein to expose the source or drain electrode 170a or 170b, is formed on the entire upper surface including the source and drain electrodes 170a, 170b. On the overcoat 180 is formed a first electrode 190 (typically, the anode) coupled to the source or drain electrode 170a or 170b through the via hole. A pixel definition layer 200 that exposes a predetermined region of the first electrode 190 to define a light emission region, and an organic thin film layer 210 and a second electrode 220 (typically, the cathode) are formed on the first electrode 190. The organic thin film layer 210 is formed with a structure in which a hole transfer layer, an organic light emission layer and an electron transfer layer are laminated, and may further include a hole injection layer and an electron injection layer.

As described above, in the case where the first electrode 180 is the anode and the second electrode 220 is the cathode, electrons injected through the second electrode 220 are recombined with holes injected through the first electrode 180 in the organic thin film layer 210 if a predetermined voltage is applied to the first electrode 180 and the second electrode 220, and then the organic light emitting diode 400 emits the light due to the presence of the energy gap generated in this process. It is to be understood that the organic light emitting diode 400 is not limited to this configuration and that the position of the anode and the cathode may be reversed. If light is incident on the organic light emitting element from an external light source while the produced light is emitted as described above, the photo diode 300, which is formed of the first semiconductor layer 130*a* including the high-concentration P doping region 131*a*, the low-concentration P doping region 131*b*, the high-concentration N doping region 132 and the intrinsic region 133, detects the light incident from the outside to generate an electrical signal according to the quantity of the light.

Figure 5:
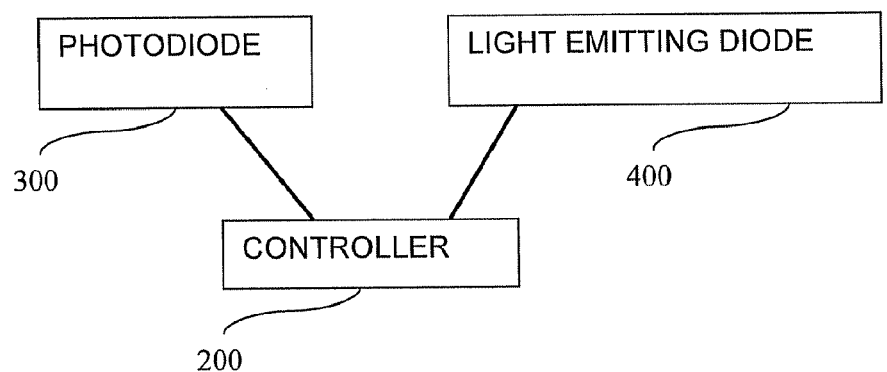
FIG. 5 is a schematic view of the photodiode, light emitting diode and controller according to an embodiment of the present invention.

The photo diode 300 is a semiconductor element that converts an optical signal into an electrical signal. Therefore, if light is incident on the photo diode under a reverse-bias state, that is to say, a state in which a negative (−) voltage is applied to the high-concentration P doping region 131*a* and a positive (+) voltage is applied to the high-concentration N doping region 132, then an electrical current flows in the photo diode as the electrons and the holes move along a depletion region formed in the intrinsic region 133. As a result, the photo diode 300 outputs a voltage that is proportional to the quantity of the light. As shown in FIG. 5, a controller 200 receives a voltage outputted from the photodiode 300 and controls a voltage applied to the light emitting diode 400. In the operation of the light emitting diode, the controller 200 receives a voltage outputted from the photodiode 300 and controls a voltage applied to the light emitting diode 400. Accordingly, the luminance of the light emitted according to the quantity of light incident from the outside may be controlled by controlling a voltage that is applied to the first electrode 180 and the second electrode 220 of the organic light emitting diode 400 according to the voltage outputted from the photo diode 300.

The first semiconductor layer 130*a* will be described in more detail, as shown below in FIG. 3A. As described above, according to aspects of the present invention, light that is incident from the outside and that transmits through a photo diode 300 or is directed toward the substrate 100 is reflected by the reflective film 110 and then, the reflected light is incident on the photo diode 300, which leads to the improvement of light detection efficiency.

In general, the first semiconductor layer 130*a* that forms the photo diode 300 is formed of polysilicon, and therefore, it is difficult to ensure a sufficient light detection efficiency since the first semiconductor layer 130*a* is typically formed at a very thin thickness of about 500 Å. Also, the light detection efficiency of display devices including a photo diode 300 may be additionally worsened as photo diodes are made smaller to accommodate a decreasing size and thickness of display devices. However, it is possible to reduce the size of the photo diode 300 since the light detection efficiency is enhanced through the presence of the reflective film 110.

Conventionally, the semiconductor layer of a photo diode is formed of a high-concentration P doping region, an intrinsic region and a high-concentration N doping region. In the case of the conventional photo diode having this general PIN structure, electrons-hole pairs are mainly generated in the intrinsic region, which is the central region of the semiconductor layer. The holes have a relatively slower mobility than the electrons and have a relatively shorter life time than the electrons since the holes have a high possibility to recombine with other electrons more quickly. An electric current flows toward the holes. According to aspects of the present invention, if a low-concentration P doping region is arranged between the intrinsic region and the high-concentration P doping region such that a point where electrons-hole pairs are generated is moved toward the low-concentration P doping region, more holes can move to an electrode while the holes are not recombined, in comparison to the case of a photo diode having a symmetrical PIN structure. Therefore, it is possible to provide more current flow under the same incident light conditions since the average life time of the holes may be extended.

If the photo diode were to be formed together with the intrinsic region to absorb the incident light by simply widening the high-concentration P doping region, then the life time of the holes would be shortened since the holes would collide with dopants while the holes passed through the high-concentration P doping region. In order to solve the above problem, a low-concentration P doping region is formed according to aspects of the present invention instead of widening the high-concentration P doping region.

Figure 3A:
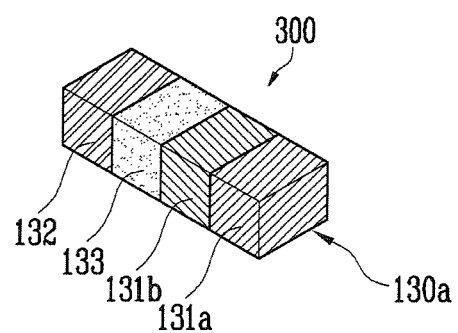
FIG. 3A is a schematic view showing a semiconductor layer of the photo diode according to one embodiment of the present invention.

FIG. 3A is a schematic view showing a first semiconductor layer 130*a* of a photo diode 300 according to one embodiment of the present invention. As shown in FIG. 3A, the photo diode 300 according to one embodiment of the present invention is formed of a first semiconductor layer 130*a* that includes a high-concentration P doping region 131*a*, a low-concentration P doping region 131*b*, a high-concentration N doping region 132 and an intrinsic region 133.

A high-concentration P doping region 131*a* and a low-concentration P doping region 131*b* are formed in one side of the intrinsic region 133, and a high-concentration N doping region 132 is formed in the other side of the intrinsic region 133. Therefore, the photo diode 300 has an asymmetrical configuration with respect to the center of the intrinsic region 133. The life time of the holes is extended since electrons-hole pairs are mainly generated in the low-concentration P doping region 131*b*. Therefore it is possible to provide greater current flow under the same incident light conditions, compared to the conventional photo diode having a symmetrical PIN structure.

Figure 3B:
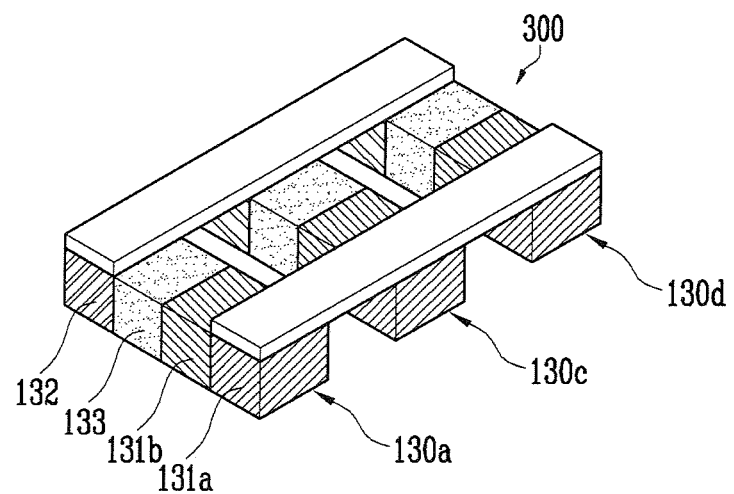
FIG. 3B is a schematic view showing photo diodes having a parallel configuration according to another embodiment of the present invention.

FIG. 3B is a schematic view showing a photo diode 300 having a parallel configuration according to another embodiment of the present invention. As shown in FIG. 3B, the photo diode 300 is formed by coupling several first semiconductor layers 130*c*, 130*d* in parallel to the first semiconductor layer 130*a* having the high-concentration P doping region 131*a*, the low-concentration P doping region 131*b*, the high-concentration N doping region 132 and the intrinsic region 133. The first semiconductor layers 130*c* and 130*d* have the same configuration as the first semiconductor layer 130*a*.

As described above, it is possible to enhance the light detection efficiency of the photo diode 300 by forming the first semiconductor layers 130*a*, 130*c*, 130*d* in parallel.

Hereinafter, the method of manufacturing an organic light emitting element according to one embodiment of the present invention will be described in detail with reference to FIG. 4A to FIG. 4F.

Figure 4A:
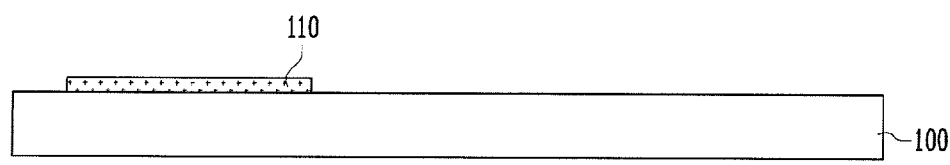
FIG. 4A to FIG. 4G are cross-sectional views showing a method of manufacturing an organic light emitting element according to the present invention.

Referring to FIG. 4A, a reflective film 110 is formed in a predetermined region by depositing one or more metals, such as Ag, Mo, Ti, Al, Ni and the like, onto a substrate 100 using a sputtering process, etc., followed by patterning the substrate 100 by an exposure and development process using a predetermined mask. The metal that forms the reflective film 110 is deposited at a suitable thickness, such as, for example a thickness of 100 to 5,000 Å, to reflect light that reaches the reflective film 110.

Figure 4B:
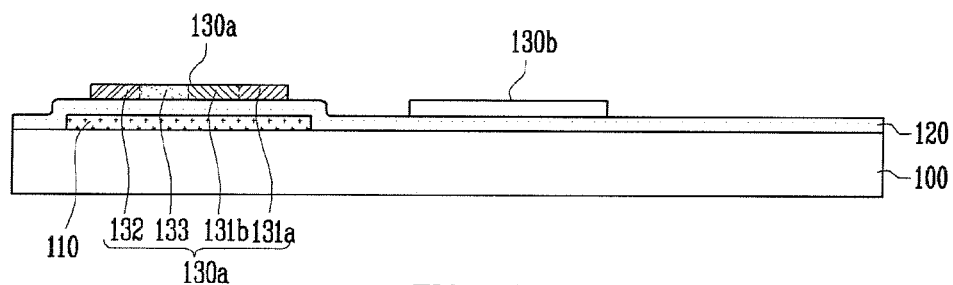

Referring to FIG. 4B, a buffer layer 120 and a semiconductor layer are sequentially formed on the entire surface of the substrate 100 including the reflective film 110, and then the semiconductor layer is patterned to provide the first semiconductor layer 130a on the reflective film 110 and the second semiconductor layer 130b on a region of the buffer layer 120 adjacent to the reflective film 110. The buffer layer 120 serves to prevent damage to the substrate 100 by the heat and may be made of an insulator such as, for example, a silicon oxide film ($SiO_2$), or a silicon nitride film ($SiN_x$). The semiconductor layer is formed of amorphous silicon or polysilicon. For example, if amorphous silicon is used, the amorphous silicon is crystallized through a heat treatment. A high-concentration P doping region 131a, a low-concentration P doping region 131b, a high-concentration N doping region 132 and an intrinsic region 133 are formed in the first semiconductor layer 130a using an N-type and P-type impurity ion injection process to provide a photo diode 300.

Figure 4C:
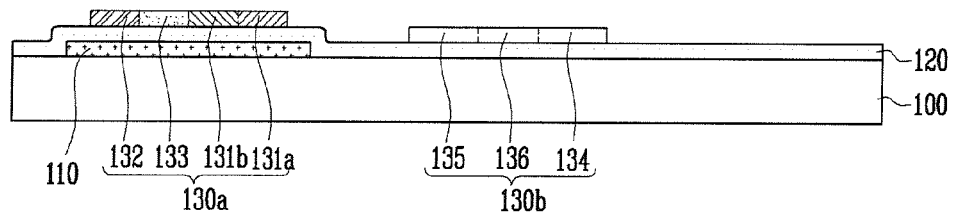

Referring to FIG. 4C, source and drain regions 134, 135 and a channel region 136 arranged between the source and drain regions 134, 135 are formed in the second semiconductor layer 130b to provide a transistor.

Figure 4D:
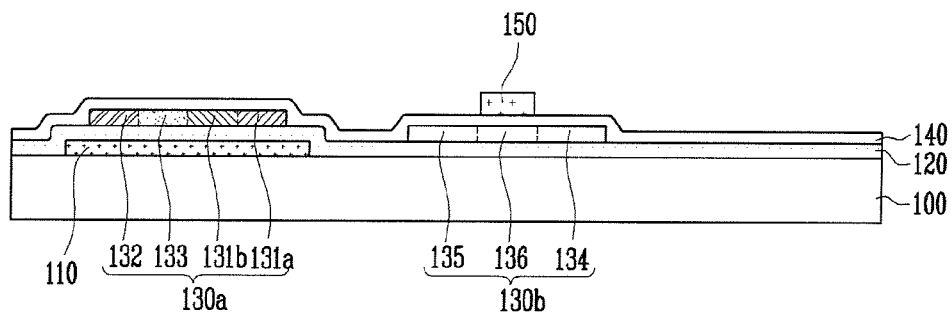

Referring to FIG. 4D, a gate insulator 140 is formed on the entire surface of the structure formed in 4C, including on the first and second semiconductor layers 130a, 130b, and a gate electrode 150 is then formed on a portion of the gate insulator 140 formed on the channel region 136.

Figure 4E:
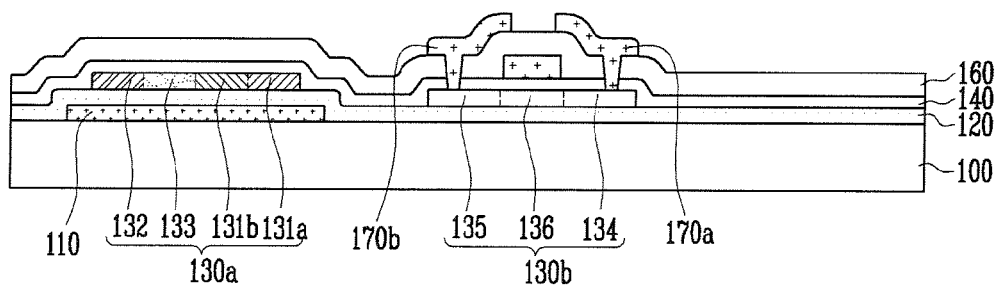

Referring to FIG. 4E, an interlayer insulator 160 is formed on the entire surface of the structure formed in 4D, including on the gate electrode 150. The interlayer insulator 160 and the gate insulator 140 are then patterned to form a contact hole so as to expose the source and drain region 134, 135 of the second semiconductor layer 130b. Source and drain electrodes 170a, 170b are formed to be coupled to the source and drain region 134, 135 through the contact hole.

Figure 4F:
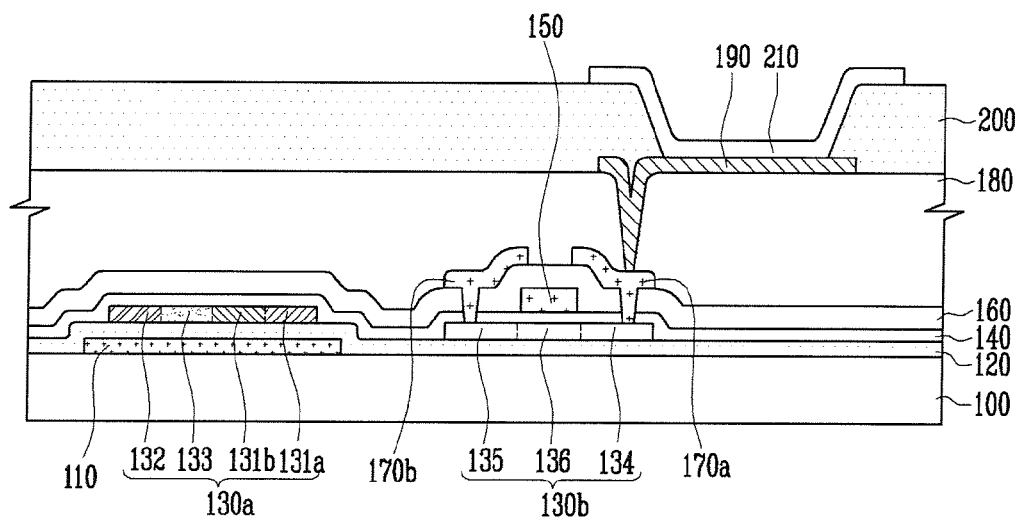

Referring to FIG. 4F, an overcoat 180 is formed on the entire surface of the structure formed in 4E to provide a flat surface, and a via hole is then formed in the overcoat 180 to expose a predetermined region of the source or drain electrode 170a or 170b. An anode electrode 190 is formed to be coupled to the source or drain electrode 170a, 170b through the via hole. A pixel definition layer 200 is formed on the overcoat 180 to expose a region of the anode electrode 190, and an organic thin film layer 210 is then formed on the exposed region of the anode electrode 190. The organic thin film layer 210 may comprise a hole transfer layer, an organic light emission layer and an electron transfer layer, which are laminated, and may further include a hole injection layer and an electron injection layer.

Figure 4G:
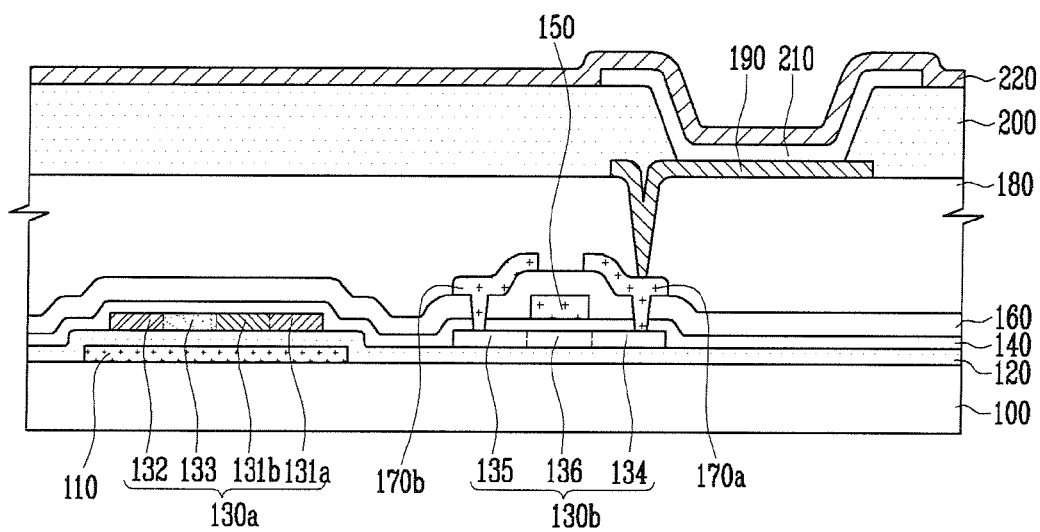

Referring to FIG. 4G, a cathode electrode 220 is formed on the pixel definition layer 200 including the organic thin film layer 210 to obtain an organic light emitting diode 400 comprising the anode electrode 190, the organic thin film layer 210 and the cathode electrode 220.

In the exemplary embodiments, the reflective film 110 may be formed with a wider area than the first semiconductor layer 130a in order to effectively reflect light that is directed toward the substrate 100. Also, although the case that a photo diode is configured so that it can detect the light incident from the outside is described in the embodiment, the present invention is not limited thereto. For example, the photo diode 300 may be configured so that it can detect the light emitted from inside the organic light emitting element and control a voltage applied to the anode electrode 180 and the cathode electrode 220 of the organic light emitting diode. Also, the organic light emitting element may be configured to be operated with a touch panel using the photo diode 300.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. An organic light emitting element, comprising:
an organic light emitting diode;
a photo diode comprising at least one semiconductor layer, each semiconductor layer comprising an intrinsic region, a high-concentration P doping region and a low-concentration P doping region disposed on a first side of the intrinsic region, and a high-concentration N doping region disposed on an opposing second side of the intrinsic region, such that the photodiode has an asymmetrical PIN (P doping region, intrinsic region, and N doping region) structure, with respect to the center of the intrinsic region; and
a controller that controls a luminance of light emitted from the organic light emitting diode to a constant level by controlling a voltage applied to the organic light emitting diode according to a voltage outputted from the photo diode.

2. The organic light emitting element according to claim 1, wherein the organic light emitting diode includes a first electrode, an organic thin film layer and a second electrode.

3. The organic light emitting element according to claim 1, wherein the organic light emitting diode is coupled to a transistor including a gate, a source and a drain.

4. The organic light emitting element according to claim 1, wherein the low-concentration P doping region of the photo diode is disposed between the high-concentration P doping region and the intrinsic region, such that a point where electron-hole pairs are generated in response to light is moved toward the low-concentration P doping region, and the average life time of holes generated is extended, in comparison to a photo diode having a symmetrical PIN structure.

5. The organic light emitting element according to claim 1, further comprising a reflective film positioned in a non-light emission region to reflect light incident from outside the organic light emitting element to the photo diode.

6. The organic light emitting element according to claim 1, further comprising a reflective film positioned to reflect light generated inside the organic light emitting element to the photo diode.

7. The organic light emitting element according to claim 5, wherein the reflective film is formed of at least one metal selected from the group consisting of Ag, Mo, Ti, Al and Ni.

8. The organic light emitting element according to claim 5, wherein the reflective film has a thickness of 100 to 5,000 Å.

9. The organic light emitting element according to claim 1, wherein the photo diode includes a plurality of the semiconductor layers coupled in parallel to each other, each of the semiconductor layers comprising the high-concentration P doping region, the low-concentration P doping region, the intrinsic region, and the high-concentration N doping region.

* * * * *